United States Patent
Chen et al.

(10) Patent No.: US 12,301,219 B2
(45) Date of Patent: May 13, 2025

(54) OVERDRIVE I/O ESD PROTECTION NETWORK

(71) Applicant: Taiwan Semiconductor Manufacturing Company, Ltd., Hsinchu (TW)

(72) Inventors: Chia-Hui Chen, Hsinchu (TW); Yu-Kai Tsai, Hsinchu (TW); Chia-Jung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 100 days.

(21) Appl. No.: 18/366,215

(22) Filed: Aug. 7, 2023

(65) Prior Publication Data
US 2025/0055449 A1 Feb. 13, 2025

(51) Int. Cl.
*H02H 9/04* (2006.01)
*H03K 17/06* (2006.01)
*H03K 17/687* (2006.01)
*H03K 19/003* (2006.01)

(52) U.S. Cl.
CPC ......... *H03K 17/063* (2013.01); *H03K 17/687* (2013.01); *H03K 19/00315* (2013.01)

(58) Field of Classification Search
None
See application file for complete search history.

(56) References Cited

U.S. PATENT DOCUMENTS

| | | | |
|---|---|---|---|
| 6,271,999 B1 * | 8/2001 | Lee | H01L 27/0259 257/567 |
| 7,054,122 B2 * | 5/2006 | Chen | H01L 27/0251 361/111 |
| 8,767,360 B2 * | 7/2014 | Lin | H02H 9/046 361/56 |

(Continued)

FOREIGN PATENT DOCUMENTS

| | | |
|---|---|---|
| CN | 101867180 A | 10/2010 |
| CN | 102170118 A | 8/2011 |

(Continued)

OTHER PUBLICATIONS

Taiwanese Office Action; Application No. 112136935; Dated Aug. 29, 2024.

*Primary Examiner* — Kenneth B Wells
(74) *Attorney, Agent, or Firm* — Jones Day (57) ABSTRACT

Systems and methods are provided for an electronic device that comprises a core logic circuit coupled to a supply voltage rail and an operating voltage rail. During a standard operation, the supply voltage rail has a supply voltage, the operating voltage rail has an operating voltage, and a post driver voltage rail has an overdrive voltage that is greater than the operating voltage. The electronic device further comprises a first power clamp circuit coupled to the supply voltage rail and the post driver voltage rail, a low-side logic-high voltage rail coupled to the first end of the core logic circuit, and a first power-to-power clamp circuit coupled to the low-side logic-high voltage rail and the post driver voltage rail. The first power-to-power clamp circuit is configured to receive electrostatic discharge (ESD) current between the post driver voltage rail and the low-side logic-high voltage rail.

20 Claims, 10 Drawing Sheets

(56) References Cited

U.S. PATENT DOCUMENTS

| | | | |
|---|---|---|---|
| 8,848,326 B2 * | 9/2014 | Lai | H01L 27/0292 |
| | | | 361/56 |
| 10,141,301 B2 * | 11/2018 | Lai | H01L 27/0266 |
| 11,296,502 B2 | 4/2022 | Lai et al. | |
| 2005/0270712 A1 | 12/2005 | Huang et al. | |
| 2010/0246074 A1 | 9/2010 | Venkatasubramanian et al. | |
| 2020/0035670 A1 | 1/2020 | Tsai et al. | |
| 2023/0215861 A1 | 7/2023 | Chen et al. | |

FOREIGN PATENT DOCUMENTS

| | | | |
|---|---|---|---|
| CN | 115864344 A | 3/2023 | |
| TW | I775364 B | 8/2022 | |

* cited by examiner

OVERDRIVE I/O ESD PROTECTION NETWORK

FIELD

The present disclosure relates to electrostatic discharge protection circuits for electronic devices.

BACKGROUND

An electrostatic discharge (ESD) protection circuit is a circuit that can be implemented within an electronic device to protect components of the electronic device during ESD discharge events. An ESD event occurs when there is a transfer of electrical charge from a component of the electronic device to or from another component of the electrical device, or a transfer of electrical charge from a component of the electronic device to or from a device or circuit external to the electronic device. An ESD event may occur, for example, due to a lightning strike, power being rapidly disconnected from the electronic device, or a sudden electrical short between two components of the electronic device.

BRIEF DESCRIPTION OF THE DRAWINGS

The following detailed description will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity and are not intended to limit the scope of the invention or the appended claims. Further, it should be understood that any one of the features can be used separately or in combination with other features. Other systems, methods, features, and advantages of the invention will be or become apparent to one with skill in the art upon examination of the detailed description. It is intended that all such additional systems, methods, features, and advantages be included within this description, be within the scope of the present invention, and be protected by the accompanying claims.

As noted above, an ESD event occurs when there is a transfer of electrical charge from a component of the electronic device to or from another component of the electrical device, or a transfer of electrical charge from a component of the electronic device to or from a device or circuit external to the electronic device. An ESD event may occur, for example, due to a lightning strike, power being rapidly disconnected from the electronic device, or a sudden electrical short between two components of the electronic device. Several drawbacks are associated with some ESD protection circuits. For example, ESD protection circuits may include a path for ESD current from the ESD event that flows from an electrical component to a common node (e.g., a supply voltage rail) of the electrical device. For electronic devices having nodes that have an overdrive voltage, this path to the common node can generate a large amount of ESD current, which can damage intermediate circuits and components that are not equipped to handle such currents. Such electronic devices may be sub-optimal, requiring costly repairs upon occurrence of ESD events, if they can be repaired at all.

In embodiments, it may be desirable for an ESD protection circuit to include ESD current paths that do not include important components (e.g., logic circuits) of the electrical device. Furthermore, it may be desirable to have multiple ESD current paths that do not include a common node to increase the reliability and the robustness of the electronic device. Embodiments disclosed herein involve ESD current paths that do not include logic circuits. Furthermore, embodiments disclosed herein decrease the magnitude of ESD current generated by a given ESD event.

Figure 1:
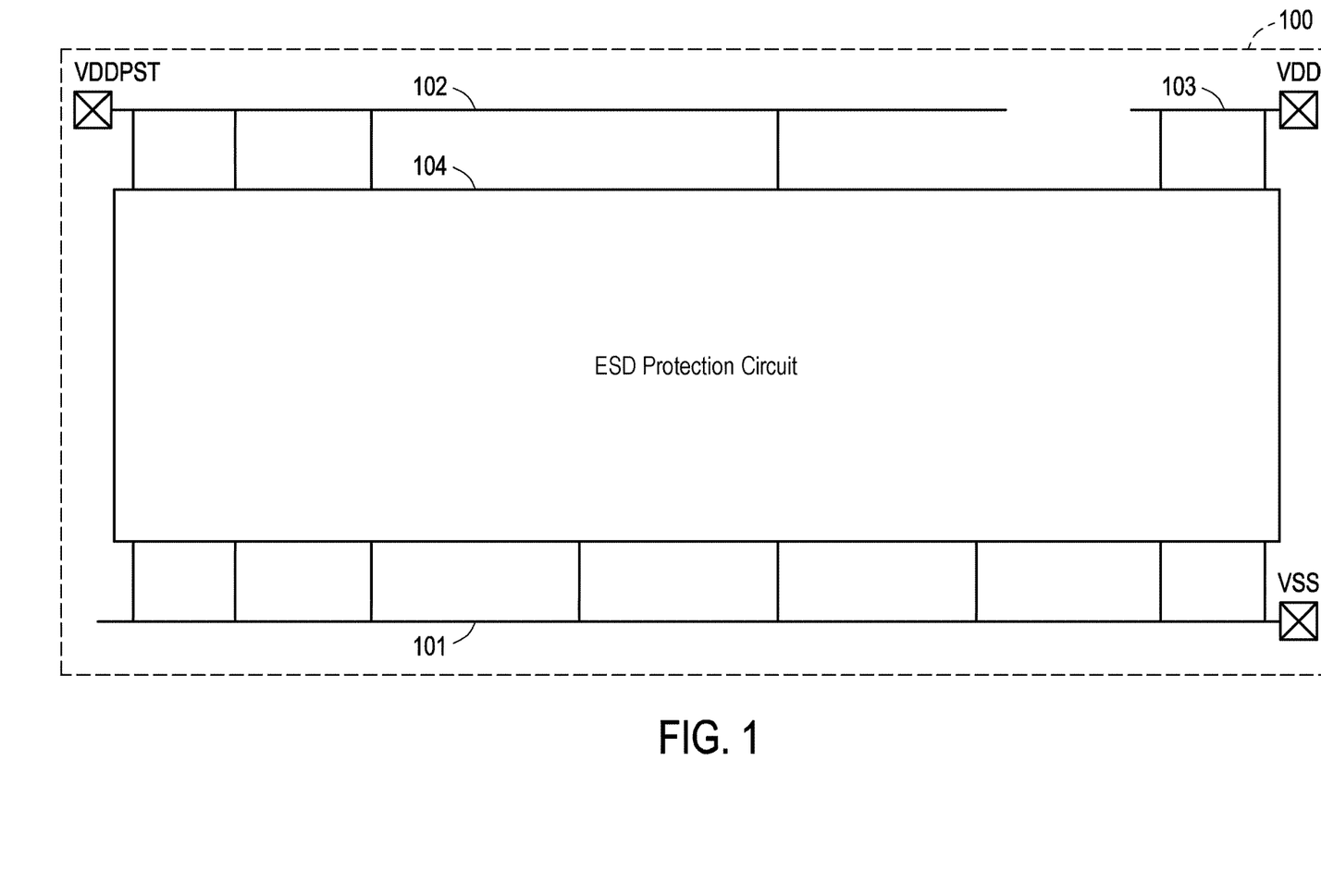
FIG. 1 depicts an electronic device having an electrostatic discharge (ESD) protection circuit, in accordance with some embodiments.

FIG. 1 depicts an electronic device having an electrostatic discharge (ESD) protection circuit, in accordance with some embodiments. In the example depicted in FIG. 1, the electronic device 100 includes a supply voltage rail VSS 101. The supply voltage rail VSS 101 may be coupled to electrical ground. The electronic device 100 further includes an operating voltage rail VDD 103 and a post driver voltage rail VDDPST 102. The operating voltage rail VDD 103 is a node having an operating voltage of a core logic circuit within the electronic device 100 and may be coupled to various components within the electrical device 100. The post driver voltage rail VDDPST 102 is a node having an overdrive voltage (e.g., an operating voltage of an input/output (I/O) interface circuit within the electronic device 100). The ESD protection circuit 104 is coupled to the supply voltage rail VSS 101, the operating voltage rail VDD 103, and the post driver voltage rail VDDPST 102.

In some example embodiments, the electronic device 100 is operating at an overdrive voltage. When the electronic device 100 is operating at the overdrive voltage, the voltage level of the post driver voltage rail VDDPST 102 is higher than the voltage of the operating voltage rail VDD 103. Furthermore, additional voltage rails may be present within the electronic device 100 having voltage levels differing from those of the operating voltage rail VDD 103 and post driver voltage rail VDDPST 102. Various electrical components and circuits of the electronic device 100 may be present between the voltage rails. An electrostatic discharge (ESD) event may cause electrical current to flow from one voltage rail to another voltage rail (e.g., from the post driver voltage rail VDDPST 102 to the operating voltage rail VDD 103) within the electronic device 100. The ESD protection circuit 104 is configured to prevent damage to the electrical components and circuits within the electronic device 100 during an ESD event.

Figure 2:
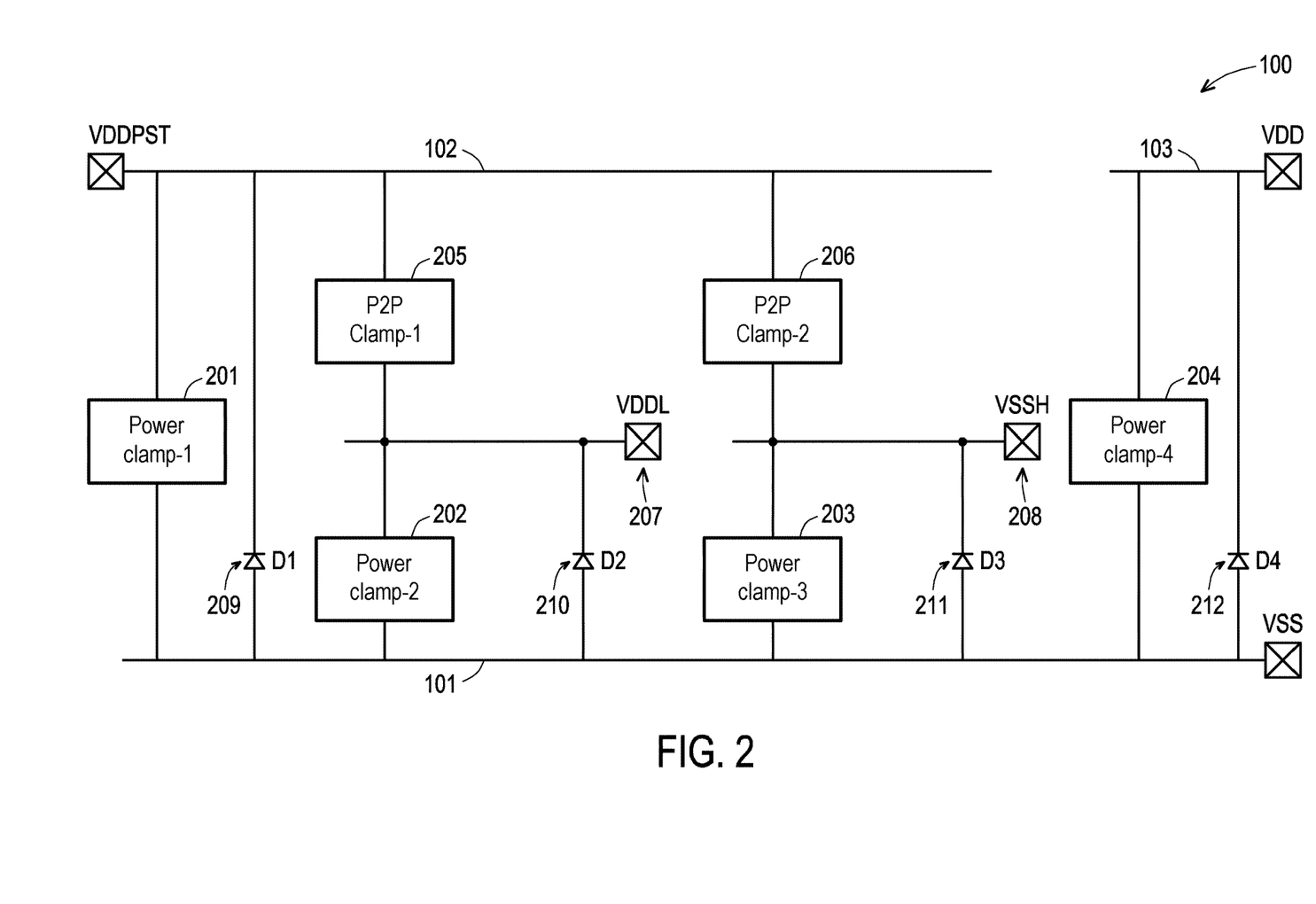
FIG. 2 depicts a detailed diagram of the electronic device having an ESD protection circuit, in accordance with some embodiments.

FIG. 2 depicts a detailed diagram of the electronic device having an ESD protection circuit, in accordance with some embodiments. In the example embodiment shown in FIG. 2, the ESD protection circuit 104 includes a low-side logic-high voltage rail VDDL 207. The low-side logic-high voltage rail VDDL 207 is coupled to a low-voltage end of the core logic circuit and contains a voltage level representing logic-high ("1") with respect to the low-voltage end. The ESD protection circuit 104 further includes a high-side logic-low voltage rail VSSH 208. The high-side logic-low voltage rail VSSH 208 is coupled to a high-voltage end of the core logic circuit and contains a voltage level representing logic-low ("0") with respect to the high-voltage end.

The ESD protection circuit 104 further includes a first power clamp circuit 201 having a first end coupled to the supply voltage rail VSS 101 and a second end coupled to the post driver voltage rail VDDPST 102. The first power clamp circuit 201 maintains a voltage difference between the supply voltage rail VSS 101 and the post driver voltage rail VDDPST 102. For example, the post driver voltage rail VDDPST 102 may have a voltage level of approximately 1.2 volts. Therefore, the first power clamp circuit 201 may maintain a voltage level of 1.2 volts between the supply voltage rail VSS 101 and the post driver voltage rail VDDPST 102. The first power clamp circuit 201 may also prevent current from flowing from the supply voltage rail VSS 101 to the post driver voltage rail VDDPST 102, while allowing current to flow from the post driver voltage rail VDDPST 102 to the supply voltage rail VSS 101. For example, the first power clamp circuit 201 may include one or more diodes having a cathode coupled to the supply voltage rail VSS 101 and an anode coupled to the post driver voltage rail VDDPST 102. The ESD protection circuit 104 further includes a first diode 209. The first diode 209 has a cathode coupled to the post driver voltage rail VDDPST 102 and an anode coupled to the supply voltage rail VSS 101. The first diode 209 may be a diode separate from the first power clamp circuit 201 or may represent a parasitic (e.g., internal) diode of the first power clamp circuit 201.

The ESD protection circuit 104 further includes a second power clamp circuit 202 having a first end coupled to the supply voltage rail VSS 101 and a second end coupled to the low-side logic-high voltage rail VDDL 207. The second power clamp circuit 202 maintains a voltage difference (e.g., 0.75 volts) between the supply voltage rail VSS 101 and the low-side logic-high voltage rail VDDL 207. The second power clamp circuit 202 may also prevent current from flowing from the supply voltage rail VSS 101 to the low-side logic-high voltage rail VDDL 207, while allowing current to flow from the low-side logic-high voltage rail VDDL 207 to the supply voltage rail VSS 101. For example, the second power clamp circuit 202 may include one or more diodes having a cathode coupled to the supply voltage rail VSS 101 and an anode coupled to the low-side logic-high voltage rail VDDL 207. The ESD protection circuit 104 further includes a second diode 210. The second diode 210 has a cathode coupled to the low-side logic-high voltage rail VDDL 207 and an anode coupled to the supply voltage rail VSS 101. The second diode 210 may be a diode separate from the second power clamp circuit 202 or may represent a parasitic (e.g., internal) diode of the second power clamp circuit 202.

The ESD protection circuit 104 further includes a third power clamp circuit 203 having a first end coupled to the supply voltage rail VSS 101 and a second end coupled to the high-side logic-low voltage rail VSSH 208. The third power clamp circuit 203 maintains a voltage difference (e.g., 0.45 volts) between the supply voltage rail VSS 101 and the high-side logic-low voltage rail VSSH 208. The third power clamp circuit 203 may also prevent current from flowing from the supply voltage rail VSS 101 to the high-side logic-low voltage rail VSSH 208, while allowing current to flow from the high-side logic-low voltage rail VSSH 208 to the supply voltage rail VSS 101. For example, the third power clamp circuit 203 may include one or more diodes having a cathode coupled to the supply voltage rail VSS 101 and an anode coupled to the high-side logic-low voltage rail VSSH 208. The ESD protection circuit 104 further includes a third diode 211. The third diode 211 has a cathode coupled to the high-side logic-low voltage rail VSSH 208 and an anode coupled to the supply voltage rail VSS 101. The third diode 211 may be a diode separate from the third power clamp circuit 203 or may represent a parasitic (e.g., internal) diode of the third power clamp circuit 203.

The ESD protection circuit 104 further includes a fourth power clamp circuit 204 having a first end coupled to the supply voltage rail VSS 101 and a second end coupled to the operating voltage rail VDD 103. The fourth power clamp circuit 204 maintains a voltage difference (e.g., 0.75 volts) between the supply voltage rail VSS 101 and the operating voltage rail VDD 103. The fourth power clamp circuit 204 may also prevent current from flowing from the supply voltage rail VSS 101 to the operating voltage rail 103, while allowing current to flow from the operating voltage rail 103 to the supply voltage rail VSS 101. For example, the fourth power clamp circuit 203 may include one or more diodes having a cathode coupled to the supply voltage rail VSS 101 and an anode coupled to the operating voltage rail VDD 103. The ESD protection circuit 104 further includes a fourth diode 212. The fourth diode 212 has a cathode coupled to the operating voltage rail 103 and an anode coupled to the supply voltage rail VSS 101. The fourth diode 212 may be a diode separate from the fourth power clamp circuit 204 or may represent a parasitic (e.g., internal) diode of the fourth power clamp circuit 204.

The ESD protection circuit 104 further includes a first power-to-power clamp circuit 205 and a second power-to-power clamp circuit 206. The first power-to-power clamp circuit 205 has a first end coupled to the low-side logic-high voltage rail VDDL 207 and a second end coupled to the post driver voltage rail VDDPST 102. The first power-to-power clamp circuit 205 maintains a voltage difference (e.g., 0.45 volts) between the low-side logic-high voltage rail VDDL 207 and the post driver voltage rail VDDPST 102. The first power-to-power clamp circuit 205 can also allow current to flow from the post driver voltage rail VDDPST 102 to the low-side logic-high voltage rail VDDL 207, while preventing current from flowing from the low-side logic-high voltage rail VDDL 207 to the post driver voltage rail VDDPST 102.

The second power-to-power clamp circuit 206 has a first end coupled to the high-side logic-low voltage rail VSSH 208 and a second end coupled to the post driver voltage rail VDDPST 102. The second power-to-power clamp circuit 206 maintains a voltage difference (e.g., 0.75 volts) between the high-side logic low voltage rail VSSH 208 and the post driver voltage rail VDDPST 102. The second power-to-power clamp circuit 206 can also allow current to flow from the post driver voltage rail VDDPST 102 to the high-side logic-low voltage rail VSSH 208, while preventing current from flowing from the high-side logic-low voltage rail VSSH 208 to the post driver voltage rail VDDPST 102. In addition to maintaining voltage levels between the various voltage rails, the first, second, third, and fourth power clamp circuits 201, 202, 203, 204, and the first and second power-to-power clamp circuits 205, 206 can provide paths for electrical current during ESD events.

For example, the first power-to-power clamp circuit 205 can provide a path for current during an ESD event causing a current to flow from the post driver voltage rail VDDPST 102 to the low-side logic-high voltage rail VDDL 207. Similarly, the second power-to-power clamp circuit 206 can provide a path for current during an ESD event causing a current to flow from the post driver voltage rail VDDPST 102 to the high-side logic-low voltage rail VSSH 208. Thus, the first power-to-power clamp circuit 205 and the second power-to-power clamp circuit 206 can protect components and circuits within the electronic device during an ESD event. For example, the electronic device 100 may include components coupled to the supply voltage node VSS 101. The first power-to-power clamp circuit 205 can prevent ESD current from flowing through the components coupled to the supply voltage node VSS 101 during an ESD event between the post driver voltage rail VDDPST 102 and the low-side logic-high voltage rail VDDL 207 by providing a current path from the post driver voltage rail VDDPST 102 to the low-side logic-high voltage rail VDDL 207.

Figure 3:
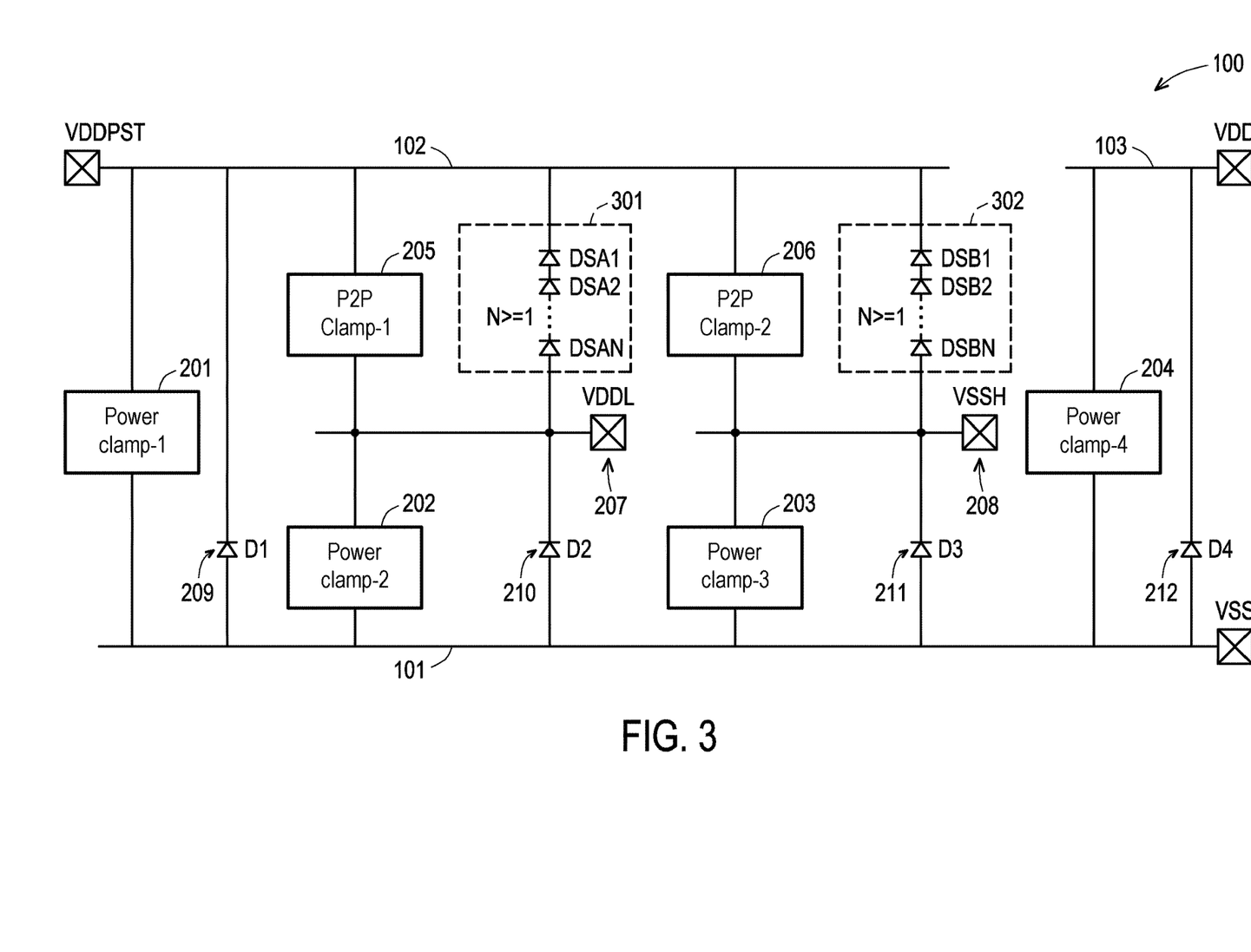
FIG. 3 depicts a detailed diagram of an electronic device having an ESD protection circuit including first and second diode strings, in accordance with some embodiments.

FIG. 3 depicts a detailed diagram of an electronic device having an ESD protection circuit including first and second diode strings, in accordance with some embodiments. In the example embodiment depicted in FIG. 3, the electronic device 100 includes a first diode string 301 having one or more diodes (DSA1, DSA2, . . . , DSAN). The first diode string 301 is coupled to the low-side logic-high voltage rail VDDL 207 and the post driver voltage rail VDDPST 107. The one or more diodes within the first diode string 301 may be coupled to one another in series. The one or more diodes include an anode coupled to the low-side logic-high voltage rail VDDL 207 and a cathode coupled to the post driver voltage rail VDDPST 107.

As described above, the first power-to-power clamp 205 may prevent current from flowing from the low-side logic-high voltage rail VDDL 207 to the post driver voltage rail VDDPST 102. Therefore, the first diode string 301 may provide a path for ESD current during an ESD event causing an electrostatic discharge from the low-side logic-high voltage rail VDDL 207 to the post driver voltage rail VDDPST 102. Furthermore, the first diode string 301 can suppress leakage current within the electronic device 100 when the low-side logic-high voltage rail VDDL 207 is at logic high and the post driver voltage rail VDDPST 102 is at logic low. In examples in which the low-side logic-high voltage rail VDDL 207 has a relatively high logic-high voltage level, more diodes may be implemented within the first diode string 301 to suppress leakage current within the electronic device 100.

The electronic device 100 further includes a second diode string 302 having one or more diodes (DSB1, DSB2, . . . , DSBN). The second diode string 302 is coupled to the high-side logic-low voltage rail VSSH 208 and the post driver voltage rail VDDPST 102. The one or more diodes within the second diode string 302 may be coupled to one another in series. The one or more diodes include an anode coupled to the high-side logic-low voltage rail VSSH 208 and a cathode coupled to the post driver voltage rail VDDPST 102.

As described above, the second power-to-power clamp 206 may prevent current from flowing from the high-side logic-low voltage rail VSSH 208 to the post driver voltage rail VDDPST 102. Therefore, the second diode string 302 may provide a path for ESD current during an ESD event causing an electrostatic discharge from the high-side logic-low voltage rail VSSH 208 to the post driver voltage rail VDDPST 102. Furthermore, the second diode string 302 can suppress leakage current within the electronic device 100 when the high-side logic-low voltage rail VSSH 208 is at logic high and the post driver voltage rail VDDPST 102 is at logic low. In examples in which the high-side logic-low voltage rail VSSH 208 has a relatively high logic-high voltage level, more diodes may be implemented within the second diode string 302 to suppress leakage current within the electronic device 100.

Figure 4:
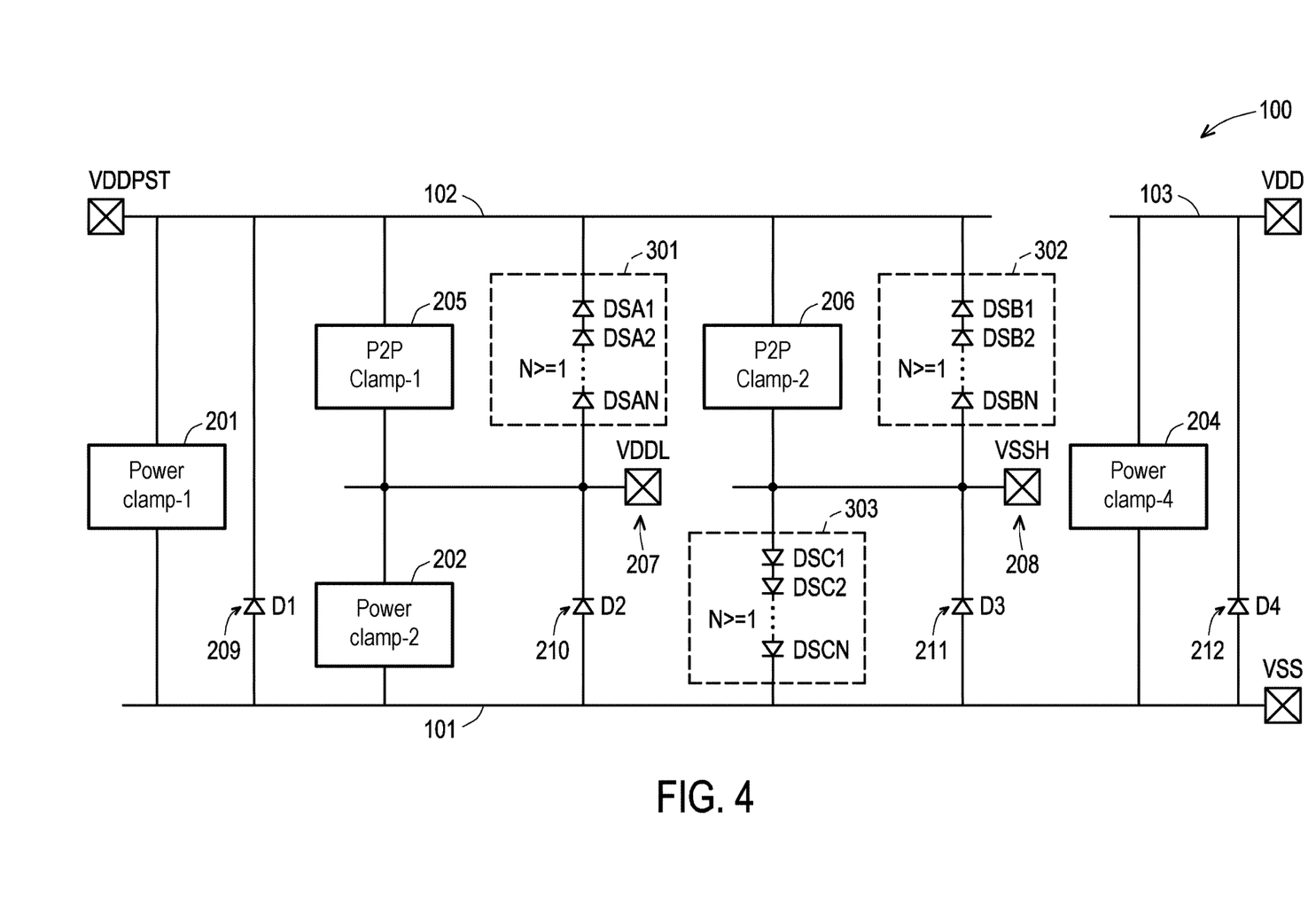
FIG. 4 depicts a detailed diagram of an electronic device having an ESD protection circuit including first, second, and third diode strings, in accordance with some embodiments.

FIG. 4 depicts a detailed diagram of an electronic device having an ESD protection circuit including first, second, and third diode strings, in accordance with some embodiments. In the example embodiment depicted in FIG. 4, the third diode string 303 is used to replace the third power clamp circuit 203 depicted in FIGS. 2 and 3. The third diode string 303 includes one or more diodes (DSC1, DSC2, . . . , DSCN) coupled to one another in series. The one or more diodes within the third diode string 303 include an anode coupled to the high-side logic-low voltage rail VSSH 208 and a cathode coupled to the supply voltage rail VSS 101. The number of diodes implemented within the third diode string 303 depends on the voltage level of the high-side logic-low voltage rail VSSH 208 during standard operations. For example, more diodes may be implemented within the third diode string 303 to suppress leakage current for a higher voltage level of the high-side logic-low voltage rail VSSH 208 during standard operations. In embodiments in which the high-side logic-low voltage rail VSSH 208 has a lower voltage level during standard operations, fewer diodes (e.g., 1 or 2 diodes) may be implemented within the third diode string 303. This can result in a decreased layout area and low leakage current, which can reduce costs and increase efficiency.

Figure 5:
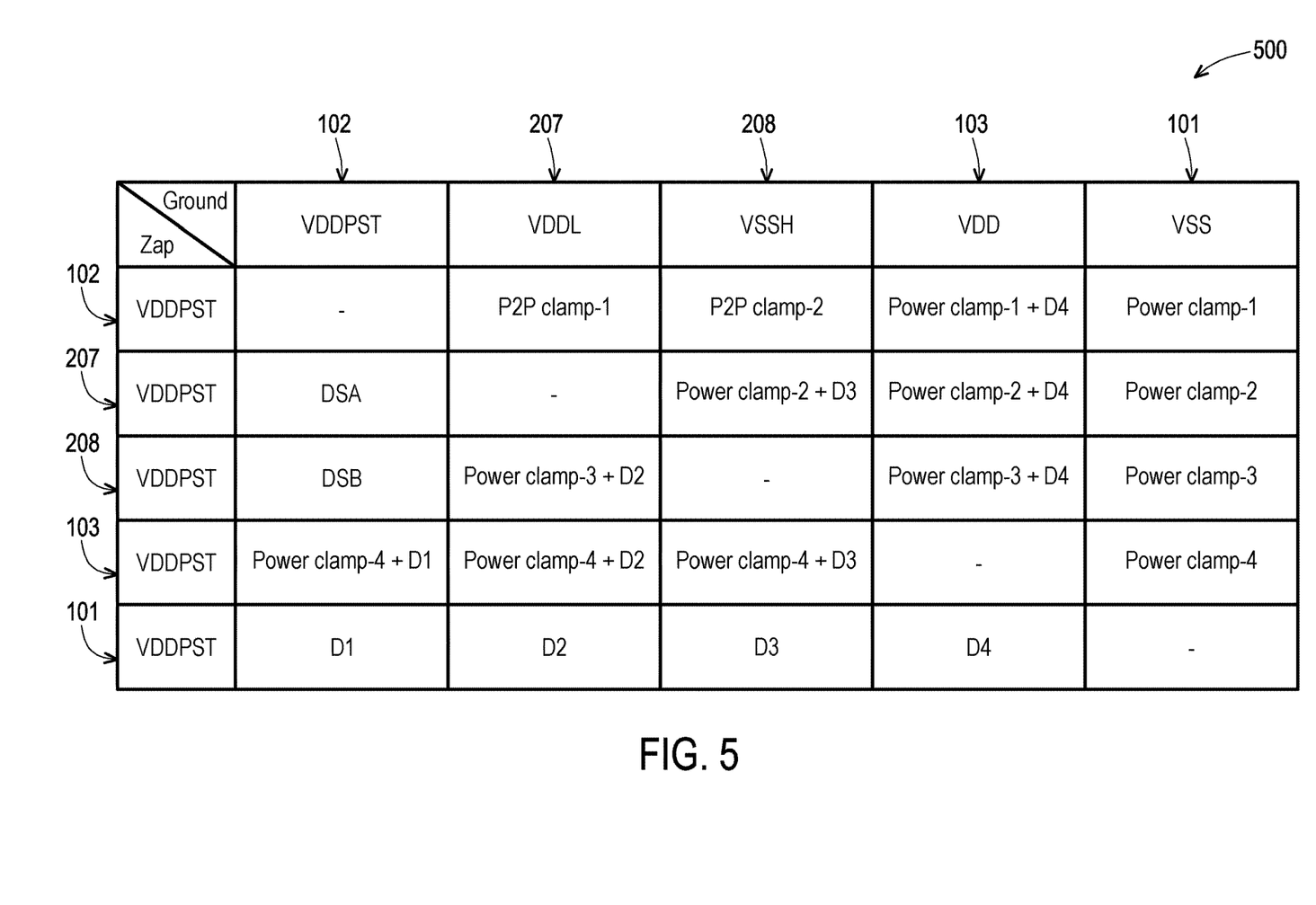
FIG. 5 depicts a table showing an ESD current path for various voltage rails, in accordance with some embodiments.

FIG. 5 depicts a table showing an ESD current path for various voltage rails, in accordance with some embodiments. In the example embodiment depicted in FIG. 5, the first column of the table 500 shows the electrostatically charged voltage rail for a given ESD event, and the first row of the table 500 shows the low-voltage voltage rail for the given ESD event. The cells of the table indicate the ESD current path for an ESD event having the specified electrostatically charged voltage rail and the specified low-voltage voltage rail. For example, the table 500 indicates that during an ESD event having an electrostatically charged voltage rail of the post driver voltage rail VDDPST 102 and a low-voltage voltage rail of the operating voltage rail VDD 103, the ESD current path is through the first power clamp 201 and the fourth diode 212. Furthermore, the table 500 indicates that during an ESD event having an electrostatically charged voltage rail of the post driver voltage rail VDDPST 102 and the low-voltage voltage rail of the high-side logic-low voltage rail VSSH 208, the ESD current path is through the second power-to-power clamp 206.

Figure 6:
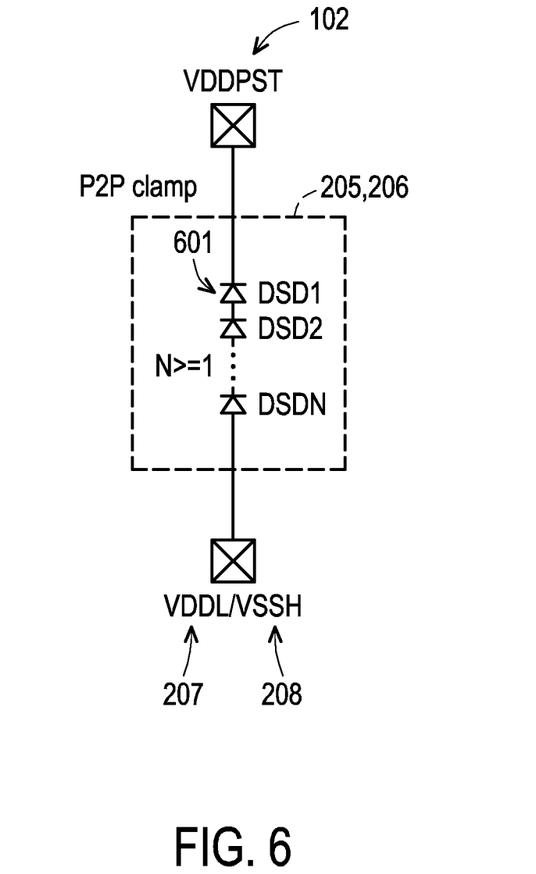
FIG. 6 depicts a power-to-power clamp circuit including a diode string, in accordance with some embodiments.

FIG. 6 depicts a power-to-power clamp circuit including a diode string, in accordance with some embodiments. The example embodiment of the power-to-power clamp circuit may be implemented as the first power-to-power clamp circuit 205 or the second power-to-power clamp circuit 206. The power-to-power clamp circuit shown in FIG. 6 includes a fourth string of diodes (DSD1, DSD2, . . . , DSDN) 601 coupled to one another in series. In an embodiment in which the power-to-power clamp circuit shown in FIG. 6 is the first power-to-power clamp circuit 205, the fourth string of diodes 601 includes an anode coupled to the post driver voltage rail VDDPST 102 and a cathode coupled to the low-side logic-high voltage rail VDDL 207. In an embodiment in which the power-to-power clamp circuit shown in FIG. 6 is the second power-to-power clamp circuit 206, the fourth string of diodes 601 includes an anode coupled to the post driver voltage rail VDDPST 102 and a cathode coupled to the high-side logic-low voltage rail VSSH 208.

The number of diodes within the fourth string of diodes 601 depends on the difference in voltage between the post driver voltage rail VDDPST 102 and the low-side logic-high voltage rail VDDL 207, or the post driver voltage rail VDDPST 102 and the high-side logic-low voltage rail VSSH 208. For example, a higher voltage differential between the post driver voltage rail VDDPST 102 and the low-side logic-high voltage rail VDDL 207 or the high-side logic-low voltage rail VSSH 208 may require more diodes within the fourth string of diodes 601 to suppress power leakage current during normal operations of the electronic device 100.

Figure 7:
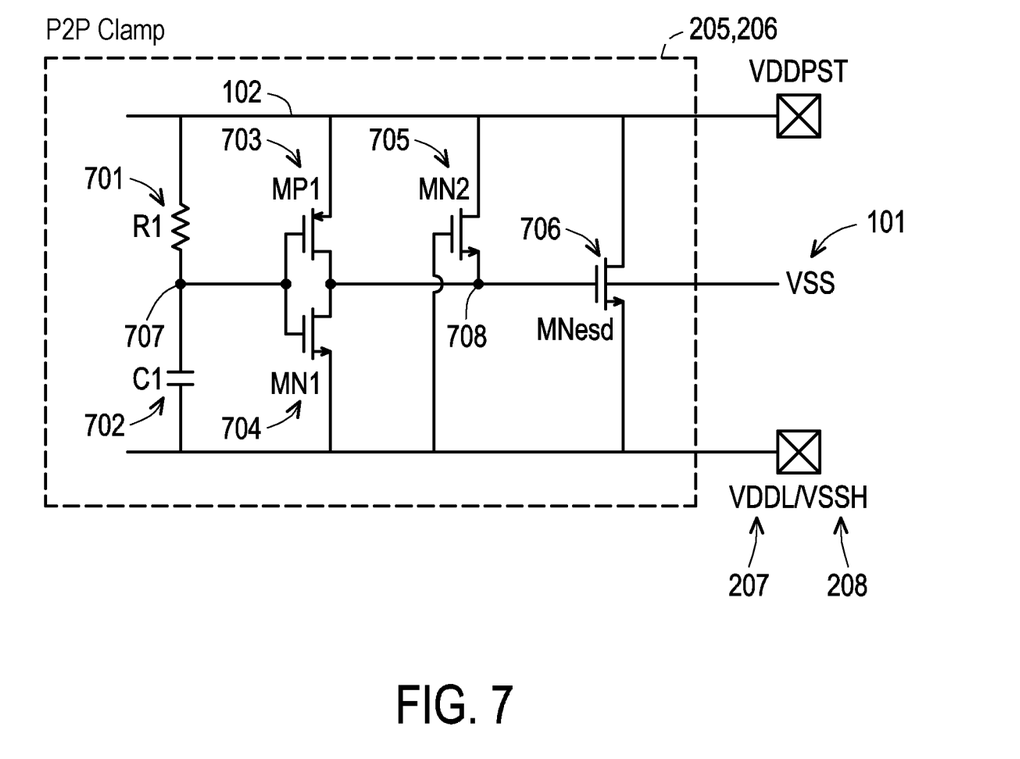
FIG. 7 depicts a power-to-power clamp circuit including transistors, in accordance with some embodiments.

FIG. 7 depicts a power-to-power clamp circuit including transistors, in accordance with some embodiments. In the example embodiment depicted in FIG. 7, the power-to-power clamp circuit can be implemented as either or both of the first power-to-power clamp circuit 205 and the second power-to-power clamp circuit 206. The power-to-power clamp circuit depicted in FIG. 7 includes a resistor R1 701 having a first end coupled to the post driver voltage rail VDDPST 102. The resistor R1 701 has a second end coupled to a first end of a capacitor C1 702. The capacitor C1 702 includes a second end coupled to the low-side logic-high voltage rail VDDL 207 or the high-side logic-low voltage rail VSSH 208. The resistor R1 701 and the capacitor C1 702 are connected to each other in series.

The power-to-power clamp circuit depicted in FIG. 7 further includes a first n-channel transistor (e.g., a metal-oxide semiconductor field-effect transistor (MOSFET)) MN1 704. The first n-channel transistor MN1 704 includes a gate terminal coupled to a first node 707. The first node 707 is further coupled to the second end of the resistor R1 701 and the first end of the capacitor C1 702. The first n-channel transistor MN1 704 further includes a drain terminal coupled to a second node 708 and a source terminal coupled to the low-side logic-high voltage rail VDDL 207 or the high-side logic-low voltage rail VSSH 208. The second node 708 is coupled to the supply voltage rail VSS 101.

The power-to-power clamp circuit further includes a first p-channel transistor 703 having a gate terminal coupled to the first node 707. The first p-channel transistor 703 further includes a source terminal coupled to the post driver voltage rail VDDPST 102 and a drain terminal coupled to the second node 708. The power-to-power clamp circuit further includes a second n-channel transistor MN2 705. The second n-channel transistor MN2 705 includes a gate terminal coupled to the low-side logic-high voltage rail VDDL 207 or the high-side logic-low voltage rail VSSH 208, a source terminal coupled to the second node 708, and a drain terminal coupled to the post driver voltage rail VDDPST 102. The power-to-power circuit further includes an ESD transistor 706. The ESD transistor 706 includes a gate terminal coupled to the second node 708. The ESD transistor 706 further includes a drain terminal coupled to the post driver voltage rail VDDPST 102 and a source terminal coupled to the low-side logic-high voltage rail VDDL 207 or the high-side logic-low voltage rail VSSH 208.

The second n-channel transistor MN2 705 is configured to disable (e.g., turn off) the ESD transistor 706 when the low-side logic-high voltage rail VDDL 207 or the high-side logic-low voltage rail VSSH 208 is at a logic high ("1") state and the post driver voltage rail VDDPST is at a logic low ("0") state. This configuration can mitigate leakage current during operation of the electronic device 100. During standard operations of the electronic device 100, the low-side logic-high voltage rail VDDL 207, the high-side logic-low voltage rail VSSH 208, and the post driver voltage rail VDDPST are at a logic high state. Thus, the second n-channel transistor MN2 705 is disabled during standard operations of the electronic device 100. Because the ESD transistor 706 is connected to the supply voltage rail VSS 101, there is no leakage current from the low-side logic-high voltage rail VDDL 207 or the high-side logic-low voltage rail VSSH 208 through a parasitic diode of the ESD transistor 706 when the low-side logic-high voltage rail VDDL 207 or the high-side logic-low voltage rail VSSH 208 is at a logic high state and the post driver voltage rail VDDPST 102 is at a logic low state.

Figure 8A:
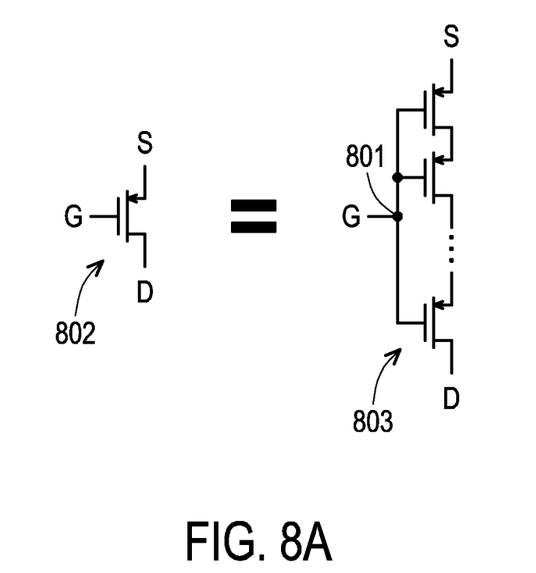
FIG. 8A depicts stacked p-channel transistors for use in a power-to-power clamp circuit, in accordance with some embodiments.

FIG. 8A depicts stacked p-channel transistors for use in a power-to-power clamp circuit, in accordance with some embodiments. In the example embodiment depicted in FIG. 8A, a single p-channel transistor 802 can be replaced by the stacked p-channel transistors 803. The stacked p-channel transistors 803 include a plurality of p-channel transistors. The single p-channel transistor 802 may represent, for example, the first p-channel transistor MP1 703 depicted in FIG. 7. The stacked p-channel transistors 803 include a p-channel gate terminal node 801 coupled to the gate terminal of each of the plurality of p-channel transistors. A source terminal node of p-channel transistors within the stacked p-channel transistors 803 is coupled to a drain terminal of an adjacent p-channel transistor.

Figure 8B:
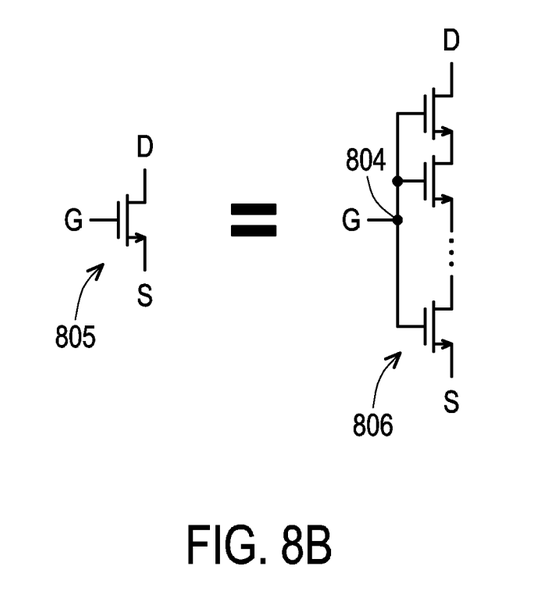
FIG. 8B depicts stacked n-channel transistors for use in a power-to-power clamp circuit, in accordance with some embodiments.

FIG. 8B depicts stacked n-channel transistors for use in a power-to-power clamp circuit, in accordance with some embodiments. In the example embodiment depicted in FIG. 8B, a single n-channel transistor 805 can be replaced by the stacked n-channel transistors 806. The stacked n-channel transistors 806 include a plurality of n-channel transistors. The single n-channel transistor 805 may represent, for example, the first n-channel transistor MN1 704 or the second n-channel transistor 705 depicted in FIG. 7. The stacked n-channel transistors 806 include an n-channel gate terminal node 804 coupled to the gate terminal of each of the plurality of n-channel transistors. A drain terminal node of n-channel transistors within the stacked n-channel transistors 806 is coupled to a source terminal of an adjacent n-channel transistor.

Figure 9:
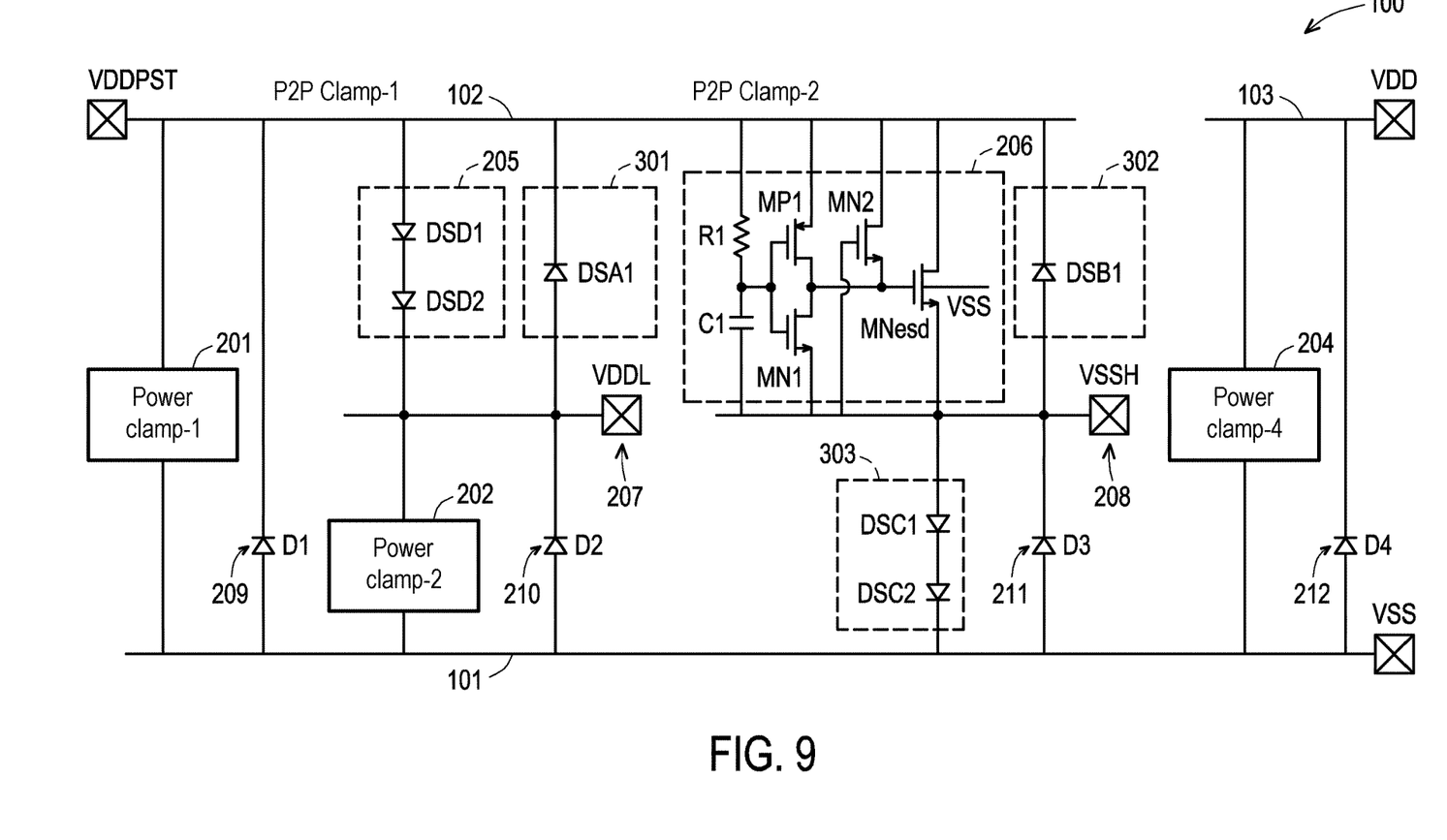
FIG. 9 depicts a diagram of an electronic device having an ESD protection circuit, in accordance with some embodiments.

FIG. 9 depicts a diagram of an electronic device having an ESD protection circuit, in accordance with some embodiments. In the example embodiment depicted in FIG. 9, the first power-to-power clamp circuit 205 includes a plurality of diodes having an anode coupled to the post driver voltage rail 102 and a cathode coupled to the low-side logic-high voltage rail VDDL 207 or the high-side logic-low voltage rail VSSH 208. The first power-to-power clamp circuit 205 depicted in FIG. 9 may be, for example, the first power-to-power clamp circuit 205 depicted in FIG. 6. The second power-to-power clamp circuit 206 depicted in FIG. 9 may be substantially similar to the power-to-power clamp circuit 206 depicted in FIG. 7. The remaining components of the electronic device 100 may be substantially similar to the components of the electronic device 100 depicted in FIG. 4.

Figure 10:
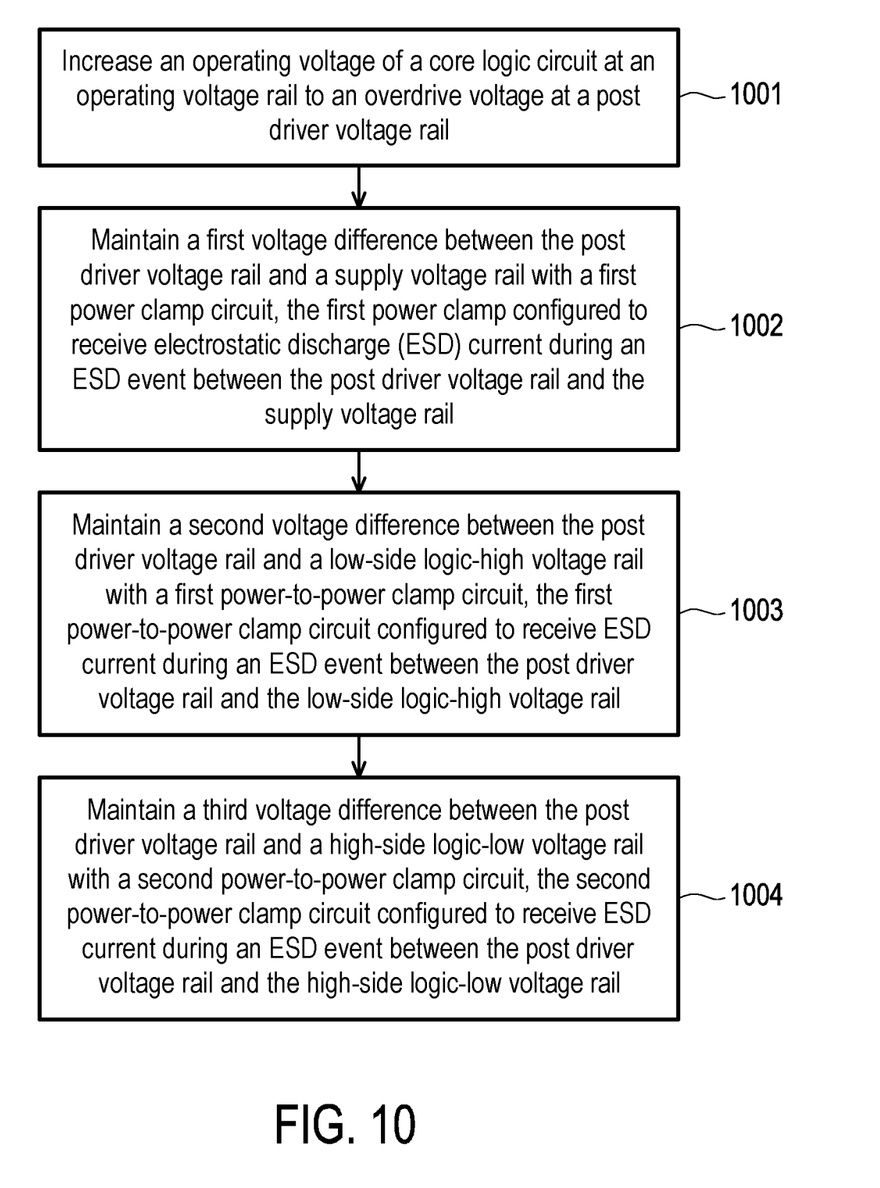
FIG. 10 depicts a method of protecting an electronic device, in accordance with some embodiments.

FIG. 10 depicts a method of protecting an electronic device, in accordance with some embodiments. The method 1000 includes a first step 1001 of increasing an operating voltage of a core logic circuit at an operating voltage rail to an overdrive voltage at a post driver voltage rail. As shown in FIGS. 1 and 2, the electronic device 100 includes an operating voltage rail 103. The operating voltage at the operating voltage rail 103 is increased to an overdrive voltage at the post driver voltage rail 102. The method 1000 further includes a second step 1002 of maintaining a first voltage difference between the post driver voltage rail and a supply voltage rail with a first power clamp circuit that is configured to receive electrostatic discharge (ESD) current during an ESD event between the post driver voltage rail and the supply voltage rail. As shown in FIG. 2, the first power clamp circuit 201 maintains a first voltage difference between the post driver voltage rail 102 and the supply voltage rail 101. As shown in the table 500 of FIG. 5, the first power clamp circuit is configured to receive ESD current during an ESD event between the post driver voltage rail 102 and the supply voltage rail 101.

The method 1000 further includes a third step 1003 of maintaining a second voltage difference between the post driver voltage rail and a low-side logic-high voltage rail with a first power-to-power clamp circuit. The first power-to-power clamp circuit is configured to receive ESD current during an ESD event between the post driver voltage rail and the low-side logic-high voltage rail. As shown in FIG. 2, the first power-to-power clamp circuit 205 maintains a second voltage difference between the post driver voltage rail 102 and the low-side logic-high voltage rail VDDL 207. Furthermore, the table 500 in FIG. 5 shows that the first power-to-power clamp circuit 205 is configured to receive ESD current during an ESD event between the post driver voltage rail 102 and the low-side logic-high voltage rail VDDL 207.

The method 1000 further includes a fourth step 1004 of maintaining a third voltage difference between the post driver voltage rail and a high-side logic-low voltage rail with a second power-to-power clamp circuit. The second power-to-power clamp circuit is configured to receive ESD current during an ESD event between the post driver voltage rail and the high-side logic-low voltage rail. As shown in FIG. 2, the second power-to-power clamp circuit 206 maintains a third voltage difference between the post driver voltage rail 102 and the high-side logic-low voltage rail VSSH 208. Furthermore, the table 500 in FIG. 5 shows that the second power-to-power clamp circuit 206 is configured to receive ESD current during an ESD event between the post driver voltage rail 102 and the high-side logic-low voltage rail VSSH 208.

Systems and methods are described herein. In one example, an electronic device comprises a core logic circuit having a first end coupled to a supply voltage rail and a second end coupled to an operating voltage rail. The supply voltage rail has a supply voltage during a standard operation and the operating voltage rail has an operating voltage during the standard operation. The electronic device further comprises a post driver voltage rail having an overdrive voltage during the standard operation. The overdrive voltage is greater than the operating voltage. The electronic device further comprises a first power clamp circuit having a first end coupled to the supply voltage rail and a second end coupled to the post driver voltage rail. The electronic device further comprises a low-side logic-high voltage rail coupled to the first end of the core logic circuit. The electronic device further comprises a first power-to-power clamp circuit having a first end coupled to the low-side logic-high voltage rail and a second end coupled to the post driver voltage rail. The first power-to-power clamp circuit is configured to receive electrostatic discharge (ESD) current between the post driver voltage rail and the low-side logic-high voltage rail.

In another example, an ESD protection circuit comprises a first power clamp circuit having a first end coupled to a supply voltage rail and a second end coupled to a post driver voltage rail. The ESD protection circuit further includes a first power-to-power clamp circuit having a first end coupled to a low-side logic-high voltage rail and a second end coupled to the post driver voltage rail. The low-side logic-high voltage rail is coupled to a low-voltage end of a core logic circuit. The first power-to-power clamp circuit is configured to receive ESD current between the post driver voltage rail and the low-side logic-high voltage rail. The ESD protection circuit further includes a second power-to-power clamp circuit having a first end coupled to a high-side logic-low voltage rail and a second end coupled to the post driver voltage rail. The high-side logic-low voltage rail is coupled to a high-voltage end of the core logic circuit. The second power-to-power clamp circuit is configured to receive ESD current between the post driver voltage rail and the high-side logic-low voltage rail.

In another example, a method of protecting an electronic device comprises increasing an operating voltage of a core logic circuit at an operating voltage rail to an overdrive voltage at a post driver voltage rail. The method further includes maintaining, with a first power clamp circuit, a first voltage difference between the post driver voltage rail and a supply voltage rail. The first power clamp circuit is configured to receive ESD current during an ESD event between the post driver voltage rail and the supply voltage rail. The method further includes maintaining, with a first power-to-power clamp circuit, a first voltage difference between the post driver voltage rail and a supply voltage rail. The first power clamp circuit is configured to receive ESD current during an ESD event between the post driver voltage rail and the low-side logic-high voltage rail. The method further includes maintaining, with a second power-to-power clamp circuit, a third voltage difference between the post driver voltage rail and a high-side logic-low voltage rail. The high-side logic-low voltage rail is coupled to a high-voltage end of the core logic circuit. The second power-to-power clamp circuit is configured to receive ESD current during an ESD event between the post driver voltage rail and the high-side logic-low voltage rail.

It will be appreciated by those skilled in the art that changes could be made to the embodiments described above without departing from the broad inventive concept thereof. It is understood, therefore, that the invention disclosed herein is not limited to the particular embodiments disclosed, and is intended to cover modifications within the spirit and scope of the present invention.

What is claimed is:

1. An electronic device comprising:
    a core logic circuit having a first end coupled to a supply voltage rail and a second end coupled to an operating voltage rail, the supply voltage rail having a supply voltage during a standard operation and the operating voltage rail having an operating voltage during the standard operation;
    a post driver voltage rail having an overdrive voltage during the standard operation, the overdrive voltage being greater than the operating voltage;
    a first power clamp circuit having a first end coupled to the supply voltage rail and a second end coupled to the post driver voltage rail;
    a low-side logic-high voltage rail coupled to the first end of the core logic circuit; and
    a first power-to-power clamp circuit having a first end coupled to the low-side logic-high voltage rail and a second end coupled to the post driver voltage rail, the first power-to-power clamp circuit configured to receive electrostatic discharge (ESD) current between the post driver voltage rail and the low-side logic-high voltage rail.

2. The electronic device of claim 1, wherein the first power-to-power clamp circuit includes a forward diode string, the forward diode string including an anode coupled to the post driver voltage rail and a cathode coupled to the low-side logic-high voltage rail.

3. The electronic device of claim 1, wherein the first power-to-power clamp circuit includes a resistor and a capacitor connected in series and a plurality of transistors.

4. The electronic device of claim 1, further comprising a second power clamp circuit having a first end coupled to the supply voltage rail and a second end coupled to the low-side logic-high voltage rail.

5. The electronic device of claim 1, further comprising a first diode string including one or more diodes, the first diode string having an anode coupled to the low-side logic-high voltage rail and a cathode coupled to the post driver voltage rail.

6. The electronic device of claim 1, further comprising:
    a high-side logic-low voltage rail coupled to the second end of the core logic circuit; and
    a second power-to-power clamp circuit having a first end coupled to the high-side logic-low voltage rail and a second end coupled to the post driver voltage rail, the second power-to-power clamp configured to receive ESD current during a second ESD event between the post driver voltage rail and the high-side logic-low voltage rail.

7. The electronic device of claim 6, wherein the second power-to-power clamp circuit includes a forward diode string, the forward diode string including an anode coupled to the post driver voltage rail and a cathode coupled to the high-side logic-low voltage rail.

8. The electronic device of claim 6, wherein the second power-to-power clamp circuit includes a resistor and a capacitor connected in series and a plurality of transistors.

9. The electronic device of claim 6, further comprising a second diode string including one or more diodes, the second diode string including an anode coupled to the high-side logic-low voltage rail and a cathode coupled to the post driver voltage rail.

10. The electronic device of claim 6, further comprising a third power clamp circuit having a first end coupled to the supply voltage rail and a second end coupled to the high-side logic-low voltage rail.

11. The electronic device of claim 6, further comprising:
    a first diode having an anode coupled to the supply voltage rail and a cathode coupled to the post driver voltage rail;
    a second diode having an anode coupled to the supply voltage rail and a cathode coupled to the low-side logic-high voltage rail;
    a third diode having an anode coupled to the supply voltage rail and a cathode coupled to the high-side logic-low voltage rail; and
    a fourth diode having an anode coupled to the supply voltage rail and a cathode coupled to the operating voltage rail.

12. The electronic device of claim 1, further comprising a fourth power clamp circuit having a first end coupled to the supply voltage rail and a second end coupled to the operating voltage rail.

13. An electrostatic discharge (ESD) protection circuit comprising:
    a first power clamp circuit having a first end coupled to a supply voltage rail and a second end coupled to a post driver voltage rail;
    a first power-to-power clamp circuit having a first end coupled to a low-side logic-high voltage rail and a second end coupled to the post driver voltage rail, the low-side logic-high voltage rail coupled to a low-voltage end of a core logic circuit, the first power-to-power clamp circuit configured to receive ESD current between the post driver voltage rail and the low-side logic-high voltage rail; and
    a second power-to-power clamp circuit having a first end coupled to a high-side logic-low voltage rail and a second end coupled to the post driver voltage rail, the high-side logic-low voltage rail coupled to a high-voltage end of the core logic circuit, the second power-to-power clamp circuit configured to receive ESD current between the post driver voltage rail and the high-side logic-low voltage rail.

14. The ESD protection circuit of claim 13, further comprising:
    a second power clamp circuit having a first end coupled to the supply voltage rail and a second end coupled to the low-side logic-high voltage rail, the second power clamp configured to receive ESD current between the supply voltage rail and the low-side logic-high voltage rail;
    a third power clamp circuit having a first end coupled to the supply voltage rail and a second end coupled to the high-side logic-low voltage rail, the third power clamp circuit configured to receive ESD current between the supply voltage rail and the high-side logic-low voltage rail; and
    a fourth power clamp circuit having a first end coupled to the supply voltage rail and a second end coupled to an operating voltage rail, the fourth power clamp circuit configured to receive ESD current between the supply voltage rail and the operating voltage rail.

15. The ESD protection circuit of claim 13, wherein the first power-to-power clamp circuit includes a forward diode string, the forward diode string including an anode coupled to the post driver voltage rail and a cathode coupled to the low-side logic-high voltage rail.

16. The ESD protection circuit of claim 13, wherein the first power-to-power clamp circuit includes a resistor and a capacitor connected in series and a plurality of transistors.

17. The ESD protection circuit of claim 13, wherein the second power-to-power clamp circuit includes a forward diode string, the forward diode string including an anode coupled to the post driver voltage rail and a cathode coupled to the low-side logic-high voltage rail.

18. The ESD protection circuit of claim 13, wherein the second power-to-power clamp circuit includes a resistor and a capacitor connected in series and a plurality of transistors.

19. A method of protecting an electronic device comprising:
increasing an operating voltage of a core logic circuit at an operating voltage rail to an overdrive voltage at a post driver voltage rail;
maintaining, with a first power clamp circuit, a first voltage difference between the post driver voltage rail and a supply voltage rail, the first power clamp circuit configured to receive electrostatic discharge (ESD) current during an ESD event between the post driver voltage rail and the supply voltage rail;
maintaining, with a first power-to-power clamp circuit, a second voltage difference between the post driver voltage rail and a low-side logic-high voltage rail, the low-side logic-high voltage rail coupled to a low-voltage end of the core logic circuit, the first power-to-power clamp circuit configured to receive ESD current during an ESD event between the post driver voltage rail and the low-side logic-high voltage rail; and
maintaining, with a second power-to-power clamp circuit, a third voltage difference between the post driver voltage rail and a high-side logic-low voltage rail, the high-side logic-low voltage rail coupled to a high-voltage end of the core logic circuit, the second power-to-power clamp circuit configured to receive ESD current during an ESD event between the post driver voltage rail and the high-side logic-low voltage rail.

20. The method of claim 19, further comprising preventing ESD current from passing through an electronic component within the electronic device, the electronic component coupled to the supply voltage rail.

* * * * *